United States Patent
Peterson et al.

(10) Patent No.: US 8,384,244 B2
(45) Date of Patent: Feb. 26, 2013

(54) RACK-BASED UNINTERRUPTIBLE POWER SUPPLY

(75) Inventors: Eric C. Peterson, Woodinville, WA (US); Shaun L. Harris, Sammamish, WA (US); Christian L. Belady, Mercer Island, WA (US); Darren A. Shakib, North Bend, WA (US); Sompong Paul Olarig, Woodinville, WA (US); Frank J. Wirtz, Seattle, WA (US)

(73) Assignee: Microsoft Corporation, Redmond, WA (US)

( * ) Notice: Subject to any disclaimer, the term of this patent is extended or adjusted under 35 U.S.C. 154(b) by 274 days.

(21) Appl. No.: 12/797,497

(22) Filed: Jun. 9, 2010

(65) Prior Publication Data

US 2011/0304211 A1 Dec. 15, 2011

(51) Int. Cl.
*H02J 7/00* (2006.01)

(52) U.S. Cl. ............. 307/66; 307/11; 307/43; 307/64; 307/65; 174/68.1; 361/627

(58) Field of Classification Search ............ 307/11, 307/43, 48, 64–66; 174/68.1; 361/627
See application file for complete search history.

(56) References Cited

U.S. PATENT DOCUMENTS

| | | | | |
|---|---|---|---|---|
| 2,798,898 A * | 7/1957 | Popovich et al. | | 174/72 B |
| 3,187,086 A * | 6/1965 | Moodie et al. | | 174/68.2 |
| 3,346,687 A * | 10/1967 | Giger, Jr. et al. | | 174/68.2 |
| 4,849,581 A * | 7/1989 | Larkin et al. | | 174/88 B |
| 5,214,314 A * | 5/1993 | Dillard et al. | | 307/147 |
| 5,466,889 A * | 11/1995 | Faulkner et al. | | 174/68.2 |
| 5,486,651 A * | 1/1996 | Morgan | | 174/68.2 |
| 5,619,014 A * | 4/1997 | Faulkner | | 174/68.2 |
| 5,694,312 A * | 12/1997 | Brand et al. | | 363/144 |
| 5,760,339 A * | 6/1998 | Faulkner et al. | | 174/88 B |
| 5,918,641 A * | 7/1999 | Hardy et al. | | 138/132 |
| 5,969,938 A * | 10/1999 | Byrne et al. | | 361/678 |
| 6,040,976 A * | 3/2000 | Bruner et al. | | 361/611 |
| 6,184,594 B1 | 2/2001 | Kushnarenko | | |
| 6,381,122 B2 * | 4/2002 | Wagener | | 361/611 |
| 6,392,141 B1 * | 5/2002 | Smith et al. | | 174/50 |
| 6,754,066 B2 * | 6/2004 | Doan et al. | | 361/600 |
| 6,786,749 B2 * | 9/2004 | Meiners et al. | | 439/213 |
| 6,836,098 B1 | 12/2004 | O'Brien | | |
| 6,856,047 B2 | 2/2005 | Murabayashi et al. | | |

(Continued)

OTHER PUBLICATIONS

Noer, Geoffrey., "Power and Cooling in a Containerised Data Center", Retrieved at << http://www.datacenterdynamics.com/ME2/dirmod.asp?sid=&nm=&type=Publishing&mod=Publications::Article&mid=8F3A7027421841978F18BE895F87F791&tier=4&id=818B9E52878348FBA2CF87C3E00FAD54 >>, Jun. 25, 2009, pp. 2.

(Continued)

*Primary Examiner* — Jared Fureman
*Assistant Examiner* — Alfonso Perez Borroto
(74) *Attorney, Agent, or Firm* — Wolfe-SBMC

(57) ABSTRACT

A rack power unit is configured to be inserted into a device rack of a data center. The rack power unit includes one or more power supplies and one or more battery packs. The one or more power supplies are each configured to receive power (e.g., AC power) when the apparatus is in the device rack, and convert the received power to a DC power. The one or more power supplies are further configured to output the DC power to a DC power bus of the device rack. The one or more battery packs are each configured to provide, in response to an interruption in the received power, DC power to the DC power bus of the device rack.

18 Claims, 8 Drawing Sheets

U.S. PATENT DOCUMENTS

| | | | |
|---|---|---|---|
| 6,934,147 B2* | 8/2005 | Miller et al. | 361/611 |
| 7,173,811 B2* | 2/2007 | Abrahamsen et al. | 361/652 |
| 7,173,821 B2* | 2/2007 | Coglitore | 361/695 |
| 7,210,048 B2 | 4/2007 | Bodas | |
| 7,271,506 B1* | 9/2007 | Bersiek | 307/125 |
| 7,296,172 B2 | 11/2007 | Hsu et al. | |
| 7,379,305 B2 | 5/2008 | Briggs et al. | |
| 7,395,444 B2 | 7/2008 | Ives | |
| 7,425,682 B2 | 9/2008 | Rasmussen et al. | |
| 7,440,260 B2* | 10/2008 | Parker et al. | 361/620 |
| 7,450,368 B2* | 11/2008 | Parker et al. | 361/611 |
| 7,495,415 B2* | 2/2009 | Kanouda et al. | 320/112 |
| 7,509,506 B2 | 3/2009 | Bahali et al. | |
| 7,514,815 B2 | 4/2009 | Paik et al. | |
| 7,519,909 B2 | 4/2009 | Kuiawa et al. | |
| 7,533,283 B2 | 5/2009 | Fung | |
| 7,542,268 B2 | 6/2009 | Johnson, Jr. | |
| 7,560,831 B2 | 7/2009 | Whitted et al. | |
| 7,561,411 B2 | 7/2009 | Johnson, Jr. | |
| 7,718,889 B2* | 5/2010 | Rasmussen et al. | 174/50 |
| 7,760,516 B2 | 7/2010 | Johnson, Jr. et al. | |
| 7,782,596 B2* | 8/2010 | Ross | 361/648 |
| 7,791,894 B2 | 9/2010 | Bechtolsheim | |
| 7,857,214 B2* | 12/2010 | Saliaris | 235/383 |
| 8,080,900 B2* | 12/2011 | Corhodzic et al. | 307/66 |
| 2001/0003207 A1 | 6/2001 | Kling et al. | |
| 2003/0052543 A1* | 3/2003 | Boost | 307/42 |
| 2003/0109965 A1* | 6/2003 | Gee | 700/295 |
| 2004/0000815 A1* | 1/2004 | Pereira | 307/11 |
| 2004/0163001 A1 | 8/2004 | Bodas | |
| 2004/0229621 A1 | 11/2004 | Misra | |
| 2004/0231875 A1* | 11/2004 | Rasmussen et al. | 174/50 |
| 2005/0052805 A1 | 3/2005 | Sato et al. | |
| 2005/0258922 A1* | 11/2005 | Rowe et al. | 335/202 |
| 2006/0002056 A1* | 1/2006 | Abrahamsen et al. | 361/652 |
| 2006/0151190 A1* | 7/2006 | Rasmussen et al. | 174/50 |
| 2006/0267409 A1* | 11/2006 | Mullet et al. | 307/64 |
| 2007/0037455 A1* | 2/2007 | Cabrera et al. | 439/709 |
| 2007/0168088 A1* | 7/2007 | Ewing et al. | 700/295 |
| 2007/0187343 A1* | 8/2007 | Colucci et al. | 211/26 |
| 2007/0217125 A1* | 9/2007 | Johnson | 361/600 |
| 2007/0217128 A1* | 9/2007 | Johnson | 361/622 |
| 2007/0217178 A1* | 9/2007 | Johnson et al. | 361/826 |
| 2007/0278860 A1 | 12/2007 | Krieger et al. | |
| 2008/0197706 A1 | 8/2008 | Nielsen | |
| 2008/0245083 A1 | 10/2008 | Tutunoglu et al. | 62/115 |
| 2009/0021078 A1* | 1/2009 | Corhodzic et al. | 307/67 |
| 2009/0034166 A1* | 2/2009 | Rasmussen et al. | 361/623 |
| 2009/0034167 A1* | 2/2009 | Rasmussen et al. | 361/627 |
| 2009/0073641 A1* | 3/2009 | Ross | 361/626 |
| 2009/0112522 A1 | 4/2009 | Rasmussen | |
| 2009/0195075 A1 | 8/2009 | Ziegler et al. | |
| 2009/0223240 A1* | 9/2009 | Bean, Jr. | 62/285 |
| 2009/0309570 A1 | 12/2009 | Lehmann et al. | |
| 2010/0020475 A1* | 1/2010 | Spitaels et al. | 361/656 |
| 2010/0275441 A1* | 11/2010 | Rasmussen et al. | 29/857 |
| 2011/0296225 A1 | 12/2011 | Belady et al. | |
| 2011/0316338 A1 | 12/2011 | Peterson et al. | |
| 2012/0098343 A1 | 4/2012 | Harris et al. | |

OTHER PUBLICATIONS

Hungria, Anderson, "Build for Today. Expand on Demand", Retrieved at http://www.youpowerthrough.com/pdf/Modularity-AndersonHungaria.pdf >>, Nov. 2008, pp. 15.

"Next Generation Data Center Infrastructure", Feb. 21, 2010, Retrieved at <<http://www.sgi.com/pdfs/4172.pdf >>, pp. 12.

"SHIP: Scalable Hierarchical Power Control for Large-Scale Data Centers", Retrieved at http://ieeexplore.ieee.org/stamp/stamp.jsp?tp=&arnumber=5260553 >>, 18th International Conference on Parallel Architectures and Compilation Techniques, 2009. 10 Pages.

Rasmussen, Neil., "Power and Cooling Capacity Management for Data Centers ", Retrieved at http://www.apcmedia.com/salestools/NRAN-6C25XM_R0_EN.pdf >>, 2007, pp. 18.

"PCT Search Report and Written Opinion", Application No. PCT/US2011/037076, (Dec. 26, 2011), 8 pages.

"PCT Search Report and Written Opinion", Application No. PCT/US2011/041022, (Dec. 20, 2011), 9 pages.

"MopUPS", Retrieved from: <http://www.chloridepower.com/en/USA/Monitoring-Tools/Software-for-UPS-monitoring-and-computer-shutdown/> on Feb. 25, 2010, (Feb. 24, 2010), 2 pages.

"PowerVision® UPS Power Management Software for Enterprises", *Powerware*, Available at <http://www.computerenvironmental.com/software/Powervision.pdf>,(Jun. 2003),6 pages.

"SmartPro Rack/Tower UPS", Retrieved from: <http://www.upsgalaxy.com/pdf/1514.pdf>on Feb. 24, 2010, Tripp Lite,(Feb. 24, 2010),5 pages.

"The High-end UPS for Top Security", *Online USV Syteme AG*, Available at <http://www.online-usv.de/downloads/db_xrt_en_2009-10-28.pdf>,(Feb. 24, 2010),6 pages.

"Ups Monitoring Software: Cut Down the Burden of Manual Ups Handling", Retrieved from: <http://www.articlesbase.com/software-articles/ups-monitoring-software-cut-down-the-burden-of-manual-ups-handling-716430.html> on Feb. 25, 2010, (Jan. 2, 2009),1 page.

Felter, Wes et al., "A Performance-Conserving Approach for Reducing Peak Power Consumption in Server Systems", *In Proceedings of ICS' 05*, (Jun. 2005),10 pages.

Kian "Monitoring UPS Power Status Using Network UPS Tools (NUT) 2.2.0 on Multiple OpenSuSE 10.3 Servers", Retrieved from: <http://www.howtoforge.com/monitoring-ups-power-status-with-nut-on-opensuse10.3> on Feb. 25, 2010, (Apr. 14, 2008),14 pages.

"HP R3000v UPS Uninterruptible Power System (UPS)", Retrieved from: <http://h18000.www1.hp.com/products/quickspecs/13129_div/13129_div.HTML> on Sep. 13, 2010, (Mar. 12, 2009),5 pages.

"International Search Report", Mailed Date: Feb. 9, 2012, Application No. PCT/US2011/037627, Filed Date: May 24, 2011, pp. 10.

"Battery Management Solutions: High Performance Analog ICs", *Linear Technology Corporation*Available at <http://www.linear.com/pc/downloadDocument.do?id=10777>,(2010),32 pages.

"End-to-End Embedded Power Solutions 2010 Product Selection Guide", *Lineage Power*, (2010),32 pages.

"Lineage Power Data Center", Retrieved from: <http://www.lineagepower.com/?page_id=275> on Dec. 9, 2010, (2010),2 pages.

"Lineage Power Energy Systems", Retrieved from: <http://www.lineagepower.com/?page_id=285> on Dec. 9, 2010, (2010),5 pages.

"Non-Final Office Action", U.S. Appl. No. 12/822,949, (Sep. 6, 2012), 9 pages.

"Non-Final Office Action", U.S. Appl. No. 12/786,800, (Oct. 30, 2012), 13 pages.

* cited by examiner

RACK-BASED UNINTERRUPTIBLE POWER SUPPLY

BACKGROUND

Situations arise where it is desirable to have a large number of computers operating together at a particular location to provide a service, such as data centers or server farms providing services over the Internet. Oftentimes it is desirable to have a constant source of power at such locations so that the computers and other devices operating at that location continue functioning. Providing a constant source of power, however, can be difficult because power providers occasionally experience power outages. Providing a backup power supply to a data center to protect against such a power outage can be beneficial, but is not without its own problems, such as the cost involved in building and maintaining such a backup power supply for the data center.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In accordance with one or more aspect, an apparatus includes one or more power supplies and one or more battery packs. The one or more power supplies are each configured to receive power, when the apparatus is in a device rack, and convert the received power to DC power. The one or more power supplies are further configured to output the DC power to a DC power bus of the device rack. The one or more battery packs are each configured to provide, in response to an interruption in the received power, DC power to the DC power bus of the device rack.

BRIEF DESCRIPTION OF THE DRAWINGS

The same numbers are used throughout the drawings to reference like features.

DETAILED DESCRIPTION

A rack-based uninterruptible power supply is discussed herein. A data center includes multiple computing devices and optionally other networking devices that are located within a device rack. AC (alternating current) power is provided to the data center from an external power source, and also from a backup generator in the event of a loss of power from the external power source. Additionally, each device rack has a rack power unit that receives the AC power and converts the AC power to DC (direct current) power, which in turn is provided to the devices located within that device rack. Each rack power unit also includes one or more battery packs that provide power to the devices within that rack during a time period between the loss of power from the external AC power source and the backup generator becoming operational and providing AC power to the data center. Each rack power unit can also provide additional functionality, such as providing additional DC power from the battery packs during times of peak usage of power by the devices within the rack.

Figure 1:
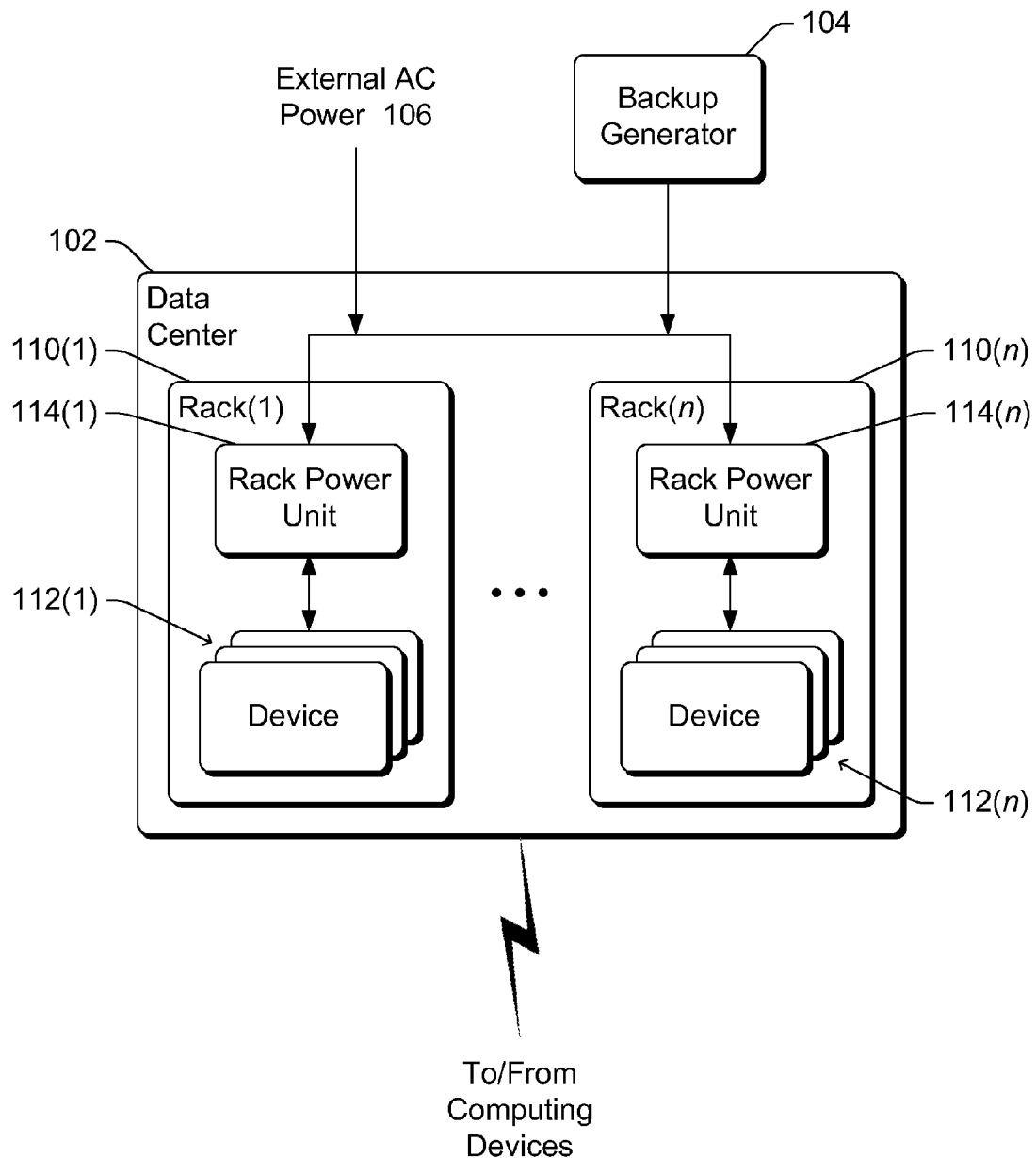
FIG. 1 illustrates an example system implementing the rack-based uninterruptible power supply in accordance with one or more embodiments.

FIG. 1 illustrates an example system 100 implementing the rack-based uninterruptible power supply in accordance with one or more embodiments. System 100 includes a data center 102, a backup generator 104, and external AC power 106 received from an external power source. Data center 102 includes one or more (n) device racks 110(1), ..., 110(n), each including one or more devices 112 and a rack power unit 114. Device racks 110 are also referred to as simply racks. Although reference is made herein to device racks, it should be noted that devices 112 and power units 114 can alternatively be grouped into other containers, mounting units, or other grouping configurations. In such situations, the rack-based uninterruptible power supply techniques discussed herein can be based on such alternate groupings rather than based on a rack.

Data center 102 operates to provide one or more services to various computing devices. These computing devices can be located in close physical proximity to data center 102, and/or located across a wide geographic range (e.g., throughout a country or throughout the world). Data center 102 can communicate with such computing devices via a variety of different networks, including the Internet, a local area network (LAN), a cellular or other phone network, an intranet, other public and/or proprietary networks, combinations thereof, and so forth. Data center 102 can be accessed by a variety of different types of computing devices, such as a desktop computer, a laptop computer, a mobile station, an entertainment appliance, a television, a set-top box communicatively coupled to a display device, a cellular or other wireless phone, a game console, an automotive computer, and so forth.

Data center 102 can provide one or more of a variety of different services to computing devices. For example, data center 102 can provide one or more of a social networking service, an email service, a search service, an information resource/storage service, a messaging service, an image and/or video sharing service, a gaming or other entertainment service, and so forth. The one or more services provided by data center 102 can be publicly available or alternatively access to one or more of the services can be restricted to particular users (e.g., those having a valid account as verified by a service of data center 102).

In system 100, external AC power 106 is power received from one or more conventional external power sources, such as a power station managed by a power utility company. External AC power 106 can be, for example, single-phase or 3-phase power. An interruption in external AC power 106 (also referred to as a power outage) can occur, and refers to a situation where the expected external AC power 106 is not received by data center 102. A variety of causes exist for such an interruption, such as a failure at a power station that provides power 106, a failure in a power transmission line between such a power station and data center 102, and so forth.

Backup generator 104 is a power generator that operates as a backup source of AC power in the event of an interruption in external AC power 106. Backup generator 104 can be, for example, a diesel-powered or gas-powered generator. Although a single backup generator 104 is illustrated in system 100, alternatively multiple backup generators 104 (e.g., each responsible for providing AC power to one or more racks 110) can be included in system 100. Backup generator 104 can provide, for example, single-phase or 3-phase AC power, typically providing the same of single-phase or 3-phase power as external AC power 106. Alternatively, backup generator 104 can provide DC power rather than AC power.

Backup generator 104 is typically located in close physical proximity to data center 102. A controller in backup generator 104, or alternatively in another component or device, detects an interruption in external AC power 106. In response to a detected interruption in external AC power 106, backup generator 104 is powered on and begins generating AC power to provide to data center 102. Typically, there is a time period between the interruption in external AC power 106 and backup generator 104 generating sufficient AC power to power data center 102 (at which point backup generator 104 is also referred to as being online). This time period can vary based on one or more of the manner in which the interruption of power is detected, the power used by data center 102, and the particular backup generator 104. Rack power units 114 within the individual racks of data center 102 provide power to the devices 112 in device racks 110 during this time period, as discussed in more detail below.

Multiple devices 112 in data center 102 operate to provide the functionality of the one or more services provided by data center 102. A variety of different types of devices can be included as devices 112. Devices 112 typically include one or more server computers, such as rack servers or blade servers. Devices 112 can also include one or more other components, such as a networking component (e.g., a gateway, a router, a switch, etc.), a data storage component (e.g., one or more magnetic disk drives), a cooling component (e.g., a fan), and so forth.

Devices 112 are located within racks 110 of data center 102. A rack 110 is a physical structure or housing into which multiple chassis can be inserted, mounted, or otherwise placed. A rack includes different physical locations where a chassis of a particular size (referred to as a rack unit or RU) can be placed. Different types of racks 110 can hold different numbers of chassis. For example, a particular rack 110 may be configured to hold 50 chassis, 90 chassis, and so forth. A chassis in turn can house a variety of different components, such as a device 112 or a rack power unit 114. Each rack 110 includes one or more data buses, one or more control buses, and one or more power buses that allow data and control information to be communicated to and from devices 112, and allow power to be communicated to devices 112.

Each rack includes one or more rack power units 114. Each rack power unit 114 receives AC power, which can be external AC power 106 or AC power from backup generator 104. Each rack power unit 114 converts the received AC power into DC power, and provides the DC power to devices 112 within the same rack as that rack power unit. For example, rack power unit 114(1) provides DC power to devices 112(1) in rack 110(1), but does not provide DC power to devices 112(n) in other racks (n) (e.g., racks in which n≧2). Additionally, although each rack 110 is illustrated in FIG. 1 as including one rack power unit 114, alternatively a rack 110 can include two or more rack power units that each provide DC power to devices within the same rack as the two or more rack power units.

Although rack power units 114 are illustrated as receiving AC power, in alternate embodiments rack power units 114 receive a DC power input. In such embodiments, rather than (or in addition to) converting received AC power into DC power, the rack power units convert received DC power to a desired voltage (e.g., as desired for a DC power bus within a rack 110 as discussed in more detail below).

Each rack power unit 114 also includes one or more battery packs that serve as an uninterruptible power supply (UPS) for devices 112 in the same rack as the rack power unit 114. In the event of an interruption in AC power received by rack power unit 114, the rack power unit 114 draws power from the one or more battery packs to provide to devices 112. Thus, if external AC power 106 is interrupted, rack power unit 114 draws power from the one or more battery packs to provide power to devices 112 until backup generator 104 provides AC power to the rack power unit 114.

Figure 2:
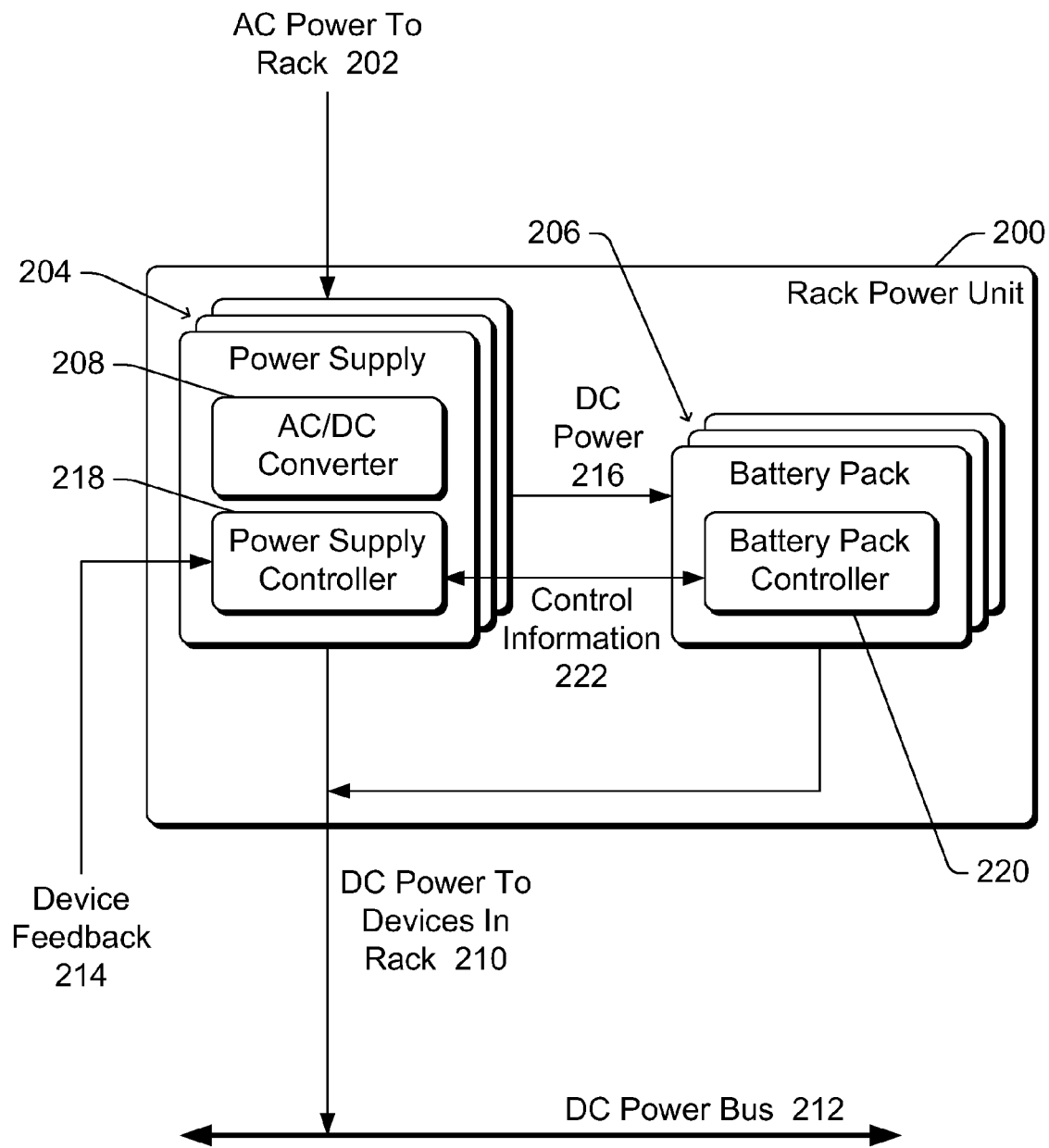
FIG. 2 is a block diagram illustrating an example rack power unit in accordance with one or more embodiments.

FIG. 2 is a block diagram illustrating an example rack power unit 200 in accordance with one or more embodiments. Rack power unit 200 is an example of a rack power unit 114 of FIG. 1. Rack power unit 200 receives AC power 202, which can be from a variety of sources, such as a power station, a backup generator, and so forth. Although illustrated as AC power, power 202 can alternatively be DC power (e.g., from a backup generator providing DC power). As discussed above, situations can arise where there is an interruption in AC power 202 from one source (e.g., a power station), followed by a time period until AC power 202 is provided by another source (e.g., a backup generator).

Rack power unit 200 includes one or more power supplies 204 and one or more battery packs 206. The number of power supplies 204 in a rack power unit 200 can vary. For example, multiple power supplies 204 can be included in rack power unit 200 for redundancy (e.g., in the event of a failure of one of the power supplies 204). Additionally, although power supplies 204 and battery packs 206 are illustrated separately, a power supply 204 and battery pack 206 can alternatively be implemented together as a single component or unit.

Power supplies 204 each include an AC/DC converter 208 that receives AC power 202, converts the received AC power to DC power, and provides DC power 210 to the devices in the same rack as rack power unit 200. DC power 210 can be any of a variety of different voltages, such as 12 volts, 24 volts, 48 volts, etc. DC power 210 is provided to the devices in the same rack as rack power unit 200 via a DC power bus 212. Each device in the same rack as rack power unit 200 is coupled to DC power bus 212. Thus, rather than converting received AC power to DC power, each device in the rack receives DC power via bus 212. Alternatively, rather than (or in addition to) AC/DC converter 208, power supplies 204 can each include a DC power converter that converts DC power received at power supplies 204 to a desired voltage for DC power bus 212.

Each of these devices in the same rack as rack power unit 200 can simply pass through the DC power received via bus 212 to the various components within the devices. Alternatively, if one or more of the components within one or more of the devices desires a different voltage, the device can increase or decrease the DC power received via bus 212. For example, if components within a device desire 24 volts whereas DC power bus 212 provides 12 volts, then a boost power converter can be included in the device to boost the 12 volts to 24 volts within the device. By way of another example, if components within a device desire 12 volts whereas DC power bus 212 provides 24 volts, then a buck converter can be included in the device to reduce the voltage from 24 volts to 12 volts within the device. Similarly, DC power can be provided on DC power bus 212 at a rate below the DC voltage desired by the devices and each device can include a boost power converter to increase the DC power to the voltage level desired within the device. For example, DC power bus 212 can provide 11 volts, and each device can include a boost power converter to boost the 11 volts to 12 volts within the device.

In the event of an interruption in AC power 202, battery packs 206 provide DC power 210 to the devices in the same rack as rack power unit 200 via DC power bus 212. It should be noted that in the rack-based uninterruptible power supply discussed herein, battery packs 206 are placed in the same rack as (and thus in close physical proximity to) the devices being powered by battery packs 206. This close physical proximity reduces (relative to environments in which the battery packs are further from the devices being powered) losses that can be incurred as power is transferred to the devices.

Furthermore, because power is distributed within the rack via DC power bus 212, conversions between AC and DC power need not be performed when providing power from battery packs 206 to the devices in the rack. Rather, the power is provided more efficiently because power losses that can be incurred when converting between AC and DC power are not experienced when providing power from battery packs 206 to the devices in the rack. No additional conversions between AC and DC power need be performed for the sole benefit of battery packs 206. Battery packs 206 are situated within rack power unit 200 to receive DC power after the received AC power has been converted by AC/DC converter 208. Thus, no conversions from AC power to DC power need be performed solely to charge battery packs 206, and when battery packs 206 are providing power to the devices in the rack no conversion to AC power need be performed.

Power supplies 204 can also receive control information from devices in the same rack as rack power unit 200 in the form of device feedback 214. Device feedback 214 can be used to facilitate the operation of power supply 204 and battery packs 206 in providing DC power 210 to the devices as discussed in more detail below. Battery packs 206 can be a variety of different types of batteries, such as sealed lead-acid batteries, lithium ion batteries and so forth.

Power supplies 204 also provide DC power 216 to battery packs 206 to recharge battery packs 206. Power supplies 204 also include power supply controllers 218 that control the providing of DC power 210 to the DC power bus 212, and also the providing of DC power 216 to battery packs 206. Each power supply 204 can include a power supply controller 218, or alternatively a single power supply controller 218 can control two or more power supplies 204.

Battery packs 206 include battery pack controllers 220 that control and/or monitor various aspects of the batteries in battery packs 206, including the providing of DC power 210 to the DC power bus 212. Each battery pack 206 can include a battery pack controller 220, or alternatively a single battery pack controller 220 can control two or more battery packs 206. In one or more embodiments, DC power 210 is also provided as DC power 216 to recharge batteries in battery packs 206. In other embodiments, DC power 216 is DC power at a different voltage level than DC power 210. For example, AC/DC converter 208 can provide a higher voltage level (e.g., in the range of 400-600 volts) as DC power 216. This higher voltage level is a voltage level commonly used during the process of converting AC power to DC power.

Rack power unit 200 thus provides a rack-based uninterruptible power supply. Rack power unit 200 need not include sufficient battery packs 206 to power all the devices in the data center in which rack power unit 200 is located. Rather, as rack power unit 200 provides power to devices in the same rack as unit 200, rack power unit 200 is concerned with providing power to the devices in the same rack as unit 200 but not other devices in the data center.

Rack power unit 200 can be implemented using a single chassis, with the power supply 204 and battery pack 206 included in that single chassis. Alternatively, rack power unit 200 can be implemented across multiple chassis, such as one or more power supplies 204 being implemented in one or more chassis, and one or more battery packs 206 being implemented in one or more chassis.

The number and capacity of the batteries in battery packs 206, as well as the number and capacity of the battery packs 206, is dependent on the amount of power used to power the devices (and components in other chassis) in the same rack as rack power unit 200. In one or more embodiments, the number and capacity of such batteries and battery packs is determined so that the devices in the rack can continue to operate with an expected power usage for a desired amount of time. This desired amount of time is also referred to as the hold-up time (the time that the battery packs are to power or hold up operation of the devices in the rack). This desired amount of time is selected by, for example, an administrator or customer of the data center in which rack power unit 200 is placed. The expected power usage can be determined by, for example, an administrator or customer of the data center in which rack power unit 200 is placed, or alternatively can be determined by another component or module based on the operation of the devices in the data center. For example, power usage by the devices can be provided to power supply controller 218 as device feedback 214, and power supply controller 218 can provide an indication (e.g., to an administrator or customer of the data center) of the expected power usage of the devices in the rack. One or more additional battery packs can also be included in rack power unit 200 for redundancy (e.g., in case a battery pack fails).

In one or more embodiments, DC power bus 212 has multiple ports that are coupled to by the computing devices powered by rack power unit 200 (e.g., bus 212 can have multiple receptacles that are physically plugged into by the devices, or can have multiple cords and plugs that are plugged into receptacles of the devices). Power supply controller 218 can manage these ports individually, allowing DC power to be turned on or turned off to a particular device as desired by controller 218. Power supply controller 218 can also monitor the power consumed at the power port, and can use the information obtained from this monitoring in different manners, such as determining an average power usage of the device (and thus of the rack that includes rack power unit 200), peak power usage of the device (and thus of the rack that includes rack power unit 200), and so forth. The manner in which this monitored information can be used is discussed in more detail below.

It should be noted that the number and capacity of the battery packs 206 can vary by rack based on the power usages of the various racks. As the number and capacity of the battery packs 206 can vary, rack power unit 200 can be equipped with a proper number of battery packs to power the various devices within the same rack as the rack power unit 200. The amount of surplus or stranded power, which refers to power that can be provided by battery packs 206 but is not used (e.g., is not used in the event of an interruption in AC power 202), can be reduced because rack power unit 200 is equipped with the appropriate number and capacity of the battery packs 210 for the power usage of the particular rack.

In one or more embodiments, power supply controller 218 receives control information 222 from battery pack controller 220. Battery pack controller 220 monitors the charge level of battery packs 206, and control information 222 can include an indication of a charge level of battery packs 206. When the charge level of battery packs 206 is below a full charge (or at least a threshold amount below a full charge), power supply controller 218 provides DC power 216 to battery packs 206 to recharge battery packs 206. Battery pack controller 220 includes battery recharging circuitry, which receives DC power 216 and recharges the batteries in battery packs 206.

Power supply controller 218 can be configured to provide DC power 216 to recharge battery packs 206 at particular times, such as when a current usage of the devices powered by rack power unit 200 is low (e.g., below a critical power threshold amount). The critical power threshold can be based on a peak power that power supply 204 can provide, such as being a fixed or relative amount less than the peak power that power supply 204 can provide, or alternatively can be based on other values. The current usage can be determined in different manners, and can be based on the average power usage of the rack, the peak power usage of the rack, and so forth. For example, DC power 216 can be provided to recharge battery packs 206 when the current usage is less than the critical power threshold.

Additionally, power supply controller 218 can be configured to determine the battery recharge rate based at least in part on a current charge of battery packs 206. Power supply controller 218 can thus recharge battery packs 206 more aggressively (e.g., regardless of current usage) when battery packs 206 have a lower charge (e.g., less than a critical threshold charge) or when battery packs 206 have a higher charge (e.g., greater than or equal to the critical threshold charge). For example, assume that it is desired for battery packs 206 to be able to provide power for 1 minute in the event of an interruption in the external AC power. If the battery packs 206 have a charge that no longer allows them to provide power for 1 minute (e.g., have less than the critical threshold charge), then power supply controller 218 sends a signal to one or more of the devices to throttle their performance such that the batteries may be recharged aggressively while maintaining input power at or below the critical power threshold. Throttling the performance of a device is discussed in more detail below. However, if the battery packs 206 are partially charged and have sufficient charge to provide power for 1 minute (e.g., have greater than or equal to the critical threshold charge), then power supply controller 218 can provide DC power 216 to recharge battery packs 206 at a lower rate and while maintaining the power usage less than the critical power threshold amount. Depending on the service level agreement requirements, the devices may not be throttled when battery charge is insufficient to provide 1 minute of back up. In this mode of operation, for example, the batteries are not charged when input power is greater than or equal to the critical power threshold and recharged at a limited rate only when input power is less than or equal to the critical power threshold.

Power supply controller 218 can also be configured to provide (or not provide) DC power 216 to recharge battery packs 206 in response to certain events. For example, power supply controller 218 can monitor the temperature of battery packs 206. Battery pack controllers 220 can provide current temperatures to power supply controller 218, or alternatively a thermometer component (not shown) can provide current temperatures to power supply controller 218. If the temperature of battery packs 206 exceeds a threshold temperature (which can vary based on, for example, the types of batteries in battery packs 206), then power supply controller can cease (or not begin) providing DC power 216 to recharge battery packs until the temperature drops (e.g., below the threshold temperature).

Furthermore, the rack-based uninterruptible power supply allows additional battery packs 206 to be easily added to rack power unit 200. If additional hold-up power is desired, additional battery packs can be easily added to rack power unit 200 by, for example, inserting one or more additional chassis with additional battery packs into the rack that includes unit 200. The additional chassis can be added without altering the operation of the data center that includes unit 200, and individual devices need not be powered down. For example, assume that the situation arises where a rack first has a power usage of 5 KW (kilowatts), so rack power unit 200 includes sufficient battery packs 206 to provide 5 KW of power for the desired time period. Following this example, assume that the utilization of one or more devices in the rack has increased, resulting in the rack having a power usage of 10 KW. Rack power unit 200 can be readily expanded by adding sufficient battery packs 206 (e.g., in one or more additional chassis) so that unit 200 provides 10 KW of power for the desired time period. This expansion of unit 200 can be performed in anticipation of the increase in power usage (e.g., if an administrator of the data center is aware of the expected increase in power usage), or can be performed as the increase in power usage is detected. This expansion can also be performed without powering down rack power unit 200 and/or the devices in the rack.

Similarly, battery packs 206 can be easily removed from rack power unit 200. Battery packs 206 can be removed while the rack is still powered and devices in the rack are still running. If it is determined (e.g., by an administrator or user of the data center that includes rack power unit 200) that there is excess battery capacity in rack power unit 200, then one or more battery packs 206 can be removed from rack power unit 200. This can be done by, for example, removing battery packs from a chassis, or removing a chassis of battery packs. These removed battery packs can then be used in another rack power unit 200 of another rack if desired.

Rack power unit 200 can be easily removed from a rack and/or changed (e.g., swapped out for a replacement rack power unit 200). This allows rack power units 200 to be replaced (e.g., in the event of failed components in the power unit, or in the event of new battery technology that an administrator or customer desires to add to the data center), to have maintenance easily performed on rack power units 200, and so forth. In situations where rack power unit 200 is implemented using multiple chassis, such chassis can be easily removed and/or changed individually. For example, a particular chassis can include one or more battery packs 206, and that particular chassis can be easily replaced with a different chassis by simply pulling out the particular chassis and inserting the replacement chassis in its place.

Chassis including one or more battery packs 206 are hot swappable, so the chassis can be removed and added while the rack is still powered and devices in the rack are still running. Chassis that include one or more power supplies 204 can also be hot swappable, assuming there are one or more other chassis in the rack with one or more power supplies 204 and/or one or more battery packs 206 to provide the power on DC power bus 212 that is lost by such a chassis being removed.

It should also be noted that the power usage of a rack is oftentimes determined based on an expected peak usage of the devices in the rack. The expected peak usage of the devices in the rack refers to the expected peak usage of the various devices in the rack combined at any given time, as opposed to the individual expected peak usages of each of the devices at any given time. Given the number of devices that can be included in a rack, this expected peak usage of the devices in the rack is typically less than the combined expected peak usage of the individual devices because at any given time it is unlikely that all the devices in the rack are operating at expected peak usage. This expected peak usage of the devices in the rack can be determined in different manners, such as based on results of testing of the devices in the rack, based on observing the operation of the devices in the rack (or similar devices in a similar rack), and so forth. Because the expected peak usage of the devices in the rack is typically less than the combined expected peak usage of the individual devices, the number and capacity of the battery packs 206 can be less than if the number and capacity of the battery packs 206 were selected based on the combined expected peak usage of the individual devices. As this reduces the number and capacity of the battery packs, it also reduces the cost of rack power unit 200 (e.g., compared to each device in the rack having its own battery).

Battery packs 206 provide power to devices in the same rack as rack power unit 200 in the event of a power outage. At some point after the power outage occurs, the providing of AC power 202 resumes (whether from the external power source or from a backup generator), at which point power supply 204 resumes providing DC power 210 and battery packs 206 cease providing DC power 210. This point at which AC power resumes (and thus battery packs 206 cease providing DC power 210) can be identified in a variety of conventional manners by power supply controller 218 and/or battery pack controller 220.

It should be noted that because AC power 202 is provided to power supply 204, yet DC power is provided by battery packs 206 to DC power bus 212, the ceasing of battery packs 206 providing DC power 210 can be performed without synchronizing AC power 202 to the power provided by battery packs 206. If the battery packs 206 were to provide AC power which is subsequently converted to DC power for use by the devices in the data center, the AC power received from an external power source or backup generator would be synchronized to the AC power provided by the battery packs by performing frequency matching or phase matching. This synchronization takes time, which would extend the time period that battery packs 206 are responsible for powering the devices in the rack. Thus, by having battery packs 206 provide DC power to DC power bus 212, this synchronization need not be performed and the time period for which battery packs 206 are responsible for powering the devices in the rack can be reduced. As this reduces the number and/or capacity of the battery packs, it also reduces the cost of rack power unit 200.

Additionally, in one or more embodiments battery pack controller 220 is configured to facilitate power smoothing on DC power bus 212. Situations can arise where there is a peak in power usage by one or more devices in the same rack as the rack power unit 200, and this peak results in the capacity of power supply 204 being exceeded (power supply 204 is unable to provide the desired power). Such peaks are oftentimes short in duration (e.g., on the order of a few seconds). Battery pack controller 220 is configured to provide DC power 210 from battery packs 206 to DC power bus 212 during these times, providing DC power 210 concurrently with power supply 204 providing DC power 210. Battery packs 206 can thus effectively absorb power usage peaks, allowing the average current drawn by devices powered by rack power unit 200 to remain approximately flat or unchanged. This allows more devices to be included in the same rack as rack power unit 200 because capacity of power supply 204 can be used to power devices in the rack during their normal operation and need not be reserved for such power usage peaks. This allows more devices to be located in the rack, and thus more devices to be included in the data center in which the rack resides. It should be noted that in such situations battery packs 206 provide DC power 210 in the absence of any interruption of AC power 202.

Peak power usage that exceeds the capacity of power supply 204 can be identified in a variety of different manners. In one or more embodiments, power supply controller 218 monitors one or more of various indicators related to power supply 204 to determine when peak power usage exceeds the capacity of power supply 204. For example, power supply controller 218 can monitor the input current of AC power 202, such as by using a series resistor or inductive loop. By way of another example, power supply controller 218 can monitor the output current of power supply 204 (DC power 210 and DC power 216), such as by using a series resistor, inductive loop, or monitoring the voltage drop across an output FET (field-effect transistor). By way of another example, power supply controller 218 can monitor the switching frequency of an output rectifier of power supply 204 (e.g., higher duty cycles indicating higher power usage). One or more of these various indicators can be used to identify the power usage of devices receiving power via DC power bus 212.

Figure 3:
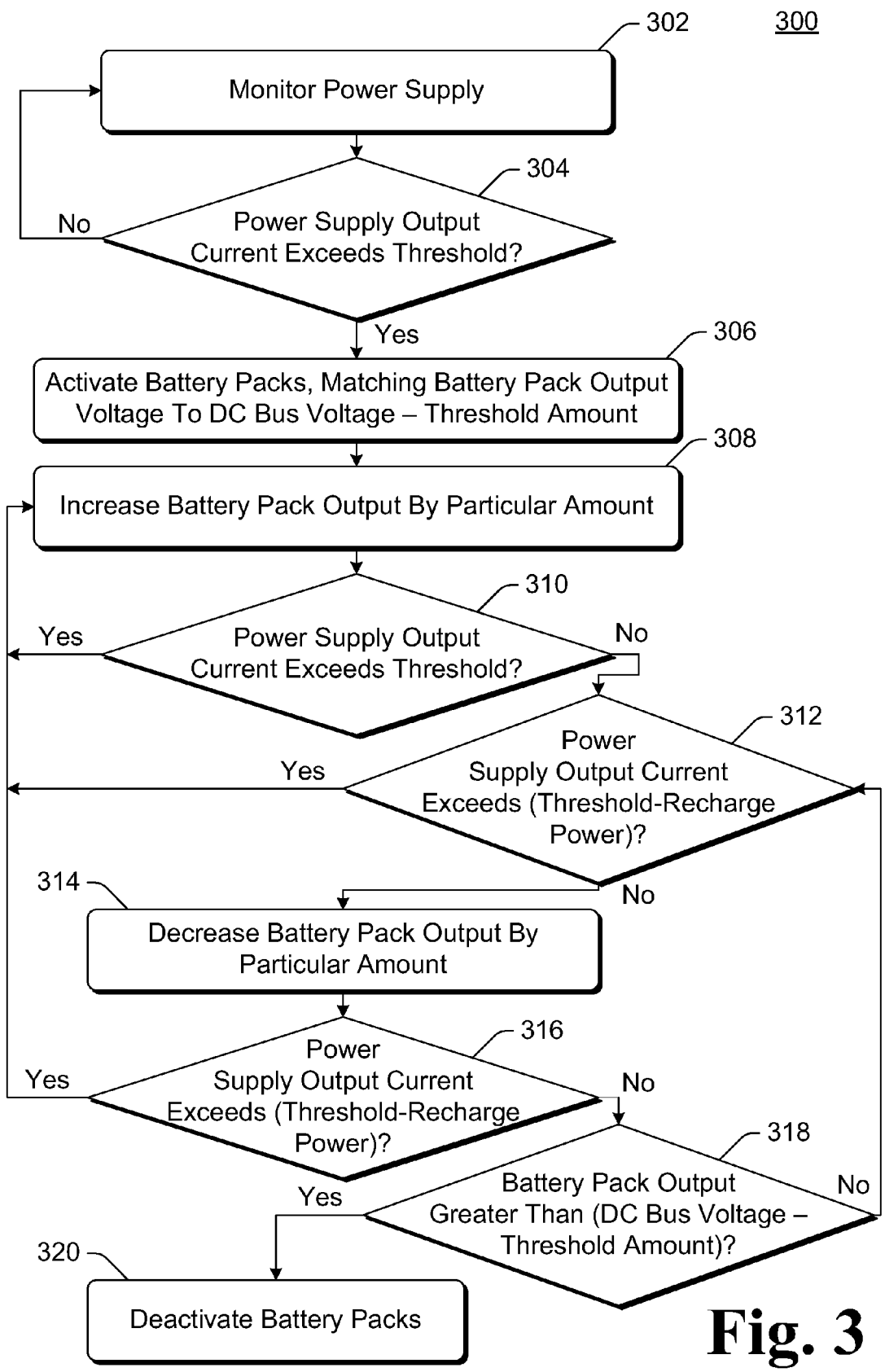
FIG. 3 is a flowchart illustrating an example process for using battery packs for power smoothing in accordance with one or more embodiments.

FIG. 3 is a flowchart illustrating an example process 300 for using battery packs for power smoothing in accordance with one or more embodiments. Process 300 is carried out by a power supply controller, such as power supply controller 218 of FIG. 2, and can be implemented in software, firmware, hardware, or combinations thereof. Process 300 is shown as a set of acts and is not limited to the order shown for performing the operations of the various acts. Process 300 is an example process for using battery packs for power smoothing; additional discussions of using battery packs for power smoothing are included herein with reference to different figures.

In process 300, the power supply is monitored (act 302). This monitoring can be monitoring of one or more of various indicators related to the power supply (e.g. power supply 204) as discussed above.

Process 300 proceeds based on whether the power supply output current exceeds a threshold amount (act 304). This power supply output current indicates the power usage of devices receiving power via the DC power bus (e.g., DC power bus 212 of FIG. 1). The threshold amount is a power usage that is close to (or alternatively equal to) the capacity of the power supply. This threshold amount can be a fixed amount (e.g., 20 amps less than the capacity of the power supply) or a relative amount (e.g., 10% less than the capacity of the power supply).

The monitoring of the power supply continues throughout process 300. If the power supply output current does not exceed the threshold amount in act 302, then the monitoring of the power supply continues without taking additional action. However, if the power supply output current does exceed the threshold amount in act 302, then the battery packs (e.g., battery packs 206 of FIG. 2) are turned on or otherwise activated (act 306). Additionally, the output voltage of the battery packs is matched to be the voltage of the DC power bus less a threshold amount. This threshold amount can be a fixed amount (e.g., 1.5 volts less than the voltage of the DC power bus) or a relative amount (e.g., 5% less than the voltage of the DC power bus).

The output voltage of the battery packs is then increased by a particular amount (act 308). This particular amount can be a fixed amount (e.g., 0.5 volts) or alternatively a relative amount (e.g., 0.5% of the current output voltage of the battery packs or 0.5% of the voltage of the DC power bus).

A check is then made as to whether the power supply output current still exceeds the threshold amount (act 310). This threshold amount in act 310 is the same threshold amount as used in act 304. If the power supply output current still exceeds the threshold amount in act 310, then process 300 returns to act 308 where the output voltage of the battery packs is again increased by the particular amount.

However, if the power supply output current does not exceed the threshold amount in act 310, then a check is made as to whether the power supply output current exceeds a threshold amount less a recharge power amount (act 312). This threshold amount in act 312 is the same threshold amount as used in acts 304 and 310. The recharge power amount is the amount of current provided to the battery packs to recharge the battery packs (e.g., as DC power 216 of FIG. 2).

If the power supply output current exceeds the threshold amount less the recharge power amount in act 312, then process 300 returns to act 308 where the output voltage of the battery packs is again increased by the particular amount.

However, if the power supply output current does not exceed the threshold amount less the recharge power amount in act 312, then the battery pack output is decreased by a particular amount (act 314). This particular amount can be a fixed or relative amount, analogous to the particular amount used in act 308. Additionally, this particular amount in act 314 can be the same amount, or alternatively a different amount, as used in act 308.

A check is then made as to whether the power supply output current exceeds a threshold amount less a recharge power amount (act 316). This check is the same check as is made in act 312. If the power supply output current exceeds the threshold amount in act 316, then process 300 returns to act 308 where the output voltage of the battery packs is again increased by the particular amount.

However, if the power supply output current does not exceed the threshold amount less the recharge power amount in act 316, then a check is made as to whether the battery pack output is greater than the voltage of the DC power bus less a threshold amount (act 318). This threshold amount can be a fixed amount or a relative amount, analogous to the threshold amount in act 306. Additionally, this threshold amount in act 318 can be the same amount, or alternatively a different amount, as used in act 306.

If the battery pack output is not greater than the voltage of the DC power bus less the threshold amount, then process 300 returns to act 312 to check whether the power supply output current exceeds a threshold amount less a recharge power amount. However, if the battery pack output is greater than the voltage of the DC power bus less the threshold amount, then the battery packs are turned off or otherwise deactivated (act 320). After the battery packs are turned off or otherwise deactivated in act 320, process 300 optionally returns to continue monitoring the power supply in act 302.

Returning to FIG. 2, rack power unit 200 thus assists in power smoothing on DC power bus 212. During these times of peak usage, the device or devices that are peaking in their power usage can receive the power they desire and continue to operate as they desire. Performance of the devices need not be cut back or throttled due to a lack of power. Furthermore, power supply 204 need not be configured to provide all of the power during these times of peak usage, but can rely on battery pack 206 during these times of peak usage.

In one or more embodiments, situations can arise where rack power unit 200 assists in power smoothing on DC power bus 212, but does not provide sufficient power to fully accommodate the peak usage. Such situations can arise, for example, where battery packs 206 do not have sufficient charge to provide power for the peak usage, where power supply controller 218 determines not to smooth (or continue to smooth) a peak usage because battery packs 206 have less than a threshold charge (e.g., less than enough charge for the desired hold-up time), and so forth. Battery pack controller 220 can detect, and notify power supply controller 218 of, such situations.

In such situations, power supply controller 218 can reduce power usage in the rack using a variety of different techniques. One such technique is referred to as throttling, which reduces the performance of the device and at the same time reduces power consumption of the device. Power supply controller 218 sends a signal (e.g., via a control bus in the rack) to one or more of the devices indicating that the one or more devices are to throttle their performance. These devices are configured in different manners to throttle their performance, such as reduce power to a component (e.g., a processor), shut down a component (e.g., shut down one of multiple processor cores), slow down operation of a component (e.g., reduce the clock speed of a processor or the rotational speed of a disk drive), and so forth. When the reduced power usage in the rack is no longer desired, power supply controller 218 indicates (e.g., by sending a signal on a control bus in the rack and/or removing a signal on a control bus in the rack) to the one or more devices indicating the devices are to no longer throttle their performance.

Power supply controller 218 can also be configured to perform device throttling in response to other events. In one or more embodiments, battery packs 206 lose capacity over their lifespan. For example, a battery pack 206 may be expected to be used for 5 years, but also be expected to hold a charge at the end of the 5 years that is only 80% of what the battery pack 206 could hold at the beginning of the 5 years. Power supply controller 218 can be configured to perform device throttling over the lifespan of the battery packs 206 to reduce the power consumption of the devices in the rack and thus allow the hold-up time of battery packs 206 to remain the same. Power supply controller 218 can perform this device throttling, in response to an interruption in AC power 202, at times when battery pack 206 is providing power to DC power bus 212, and so forth.

Another event in response to which power supply controller 218 can be configured to perform device throttling is any other reduction in the capacity of battery pack 206. In addition to losing capacity over their lifespan, reductions in the capacity of a battery pack can occur in response to other events, such as failure of a battery pack 206.

Returning to FIG. 1, different rack power units 114 are used in different racks. These different rack power units 114 can be configured in the same manner (e.g., having the same number of battery packs), or alternatively can be configured differently. Different users of data center 102, such as different companies or different business units within the same company, are assigned different racks 110 and are able to select the configuration of their own rack power units 114. These different companies or business units can thus have different UPS configurations even though their devices are in the same data center 102. These different UPS configurations can allow for different hold-up times, different recharge rates, and so forth.

For example, a first business unit may desire to have sufficient battery power to power the devices in their rack for the time period between a power interruption of external AC power 106 and backup generator 104 being online, and accordingly would have a rack power unit 114 with sufficient battery packs to provide this power. A second business unit may desire to have sufficient battery power to provide some power smoothing during times of peak power usage, but not be concerned with a power interruption of external AC power 106. Accordingly, this second business unit would have a rack power unit 114 with sufficient battery packs to provide this power smoothing capability. The second business unit would not have battery power in the event of a power interruption of external AC power 106, but would also not have the cost of purchasing and maintaining battery packs to provide battery power in the event of a power interruption of external AC power 106. A third business unit may not be interested in spending money on any batteries, and accordingly would have a rack power unit 114 with no battery packs.

Continuing with this example, all three of these business units have racks 110 in the same data center 102, but have rack power units 114 that are configured differently. In the event of a power interruption in external AC power 106, the devices of the first business unit would continue running on battery power, but the devices of the second and third business units would shut down due to a lack of battery power. However, when backup generator 104 is online and providing AC power, the devices of the first business unit would cease running on battery power in favor of the AC power from backup generator 104, and the devices of the second and third business units would restart and resume running on AC power from backup generator 104.

Allowing different users of data center 102 to select the configuration of their own rack power units 114 also allows the users of data center 102 to determine the amount of capacity they desire for the battery packs of their rack power unit. This capacity refers to an amount of power that the battery packs can provide to the devices in that rack. In the event of a power interruption in external AC power 106, if the capacity of the battery packs is exceeded then the rack power unit that includes those battery packs can shut down, which results in the devices in the rack that includes that rack power unit losing power. Some users may desire to have an amount of excess capacity for their battery packs, while other users do not.

For example, a first business unit may desire to have battery pack capacity that exceeds their peak power usage by 10%, and accordingly would have a rack power unit 114 with sufficient battery packs to provide this capacity. A second business unit may desire to have battery pack capacity that exceeds their average power usage by 10%, and accordingly would have a rack power unit 114 with sufficient battery packs to provide this capacity. Thus, the second business unit would not spend as much money on battery packs because they are basing their capacity decision on average power usage rather than peak power usage. In the event of a power interruption in external AC power 106, if the devices of the second business unit were to exceed their average power usage by more than 10%, the rack power unit 114 of the second business unit would shut down and the devices of the second business unit would shut down due to a lack of battery power (or alternatively other remedial action would be taken, such as throttling of the devices of the second business unit). However, the devices of the first business unit would continue operating, assuming the devices of the first business unit do not exceed their peak power usage by more than 10%.

Similarly, different users of data center 102 can select a recharge rate used by the power supply controller (e.g., controller 218 of FIG. 2) to recharge the battery packs of their rack power unit. The power supply controller can be configured to recharge the battery packs at different rates, with faster rates recharging battery packs more quickly but utilizing more power, and slower rates recharging battery packs less quickly but utilizing less power. The more power that the power supply controller uses to recharge the battery packs, the less power that is available to provide to devices 112 in the rack. Accordingly, if the power supply controller is configured for a faster rate of recharging the battery packs, then the power supply controller reduces the power that it provides to the devices via the DC power bus in the rack while the battery packs are recharging. The power supply controller can reduce the power it provides to the devices in different manners, such as using device throttling as discussed above, by turning off ports as discussed above, and so forth.

Alternatively, rather than reducing the power it provides to the devices in the rack 110, data center 102 can be configured to provide additional AC power to rack 110. Thus, the power supply controller can be configured to recharge the battery packs at a faster rate and at the same time not reduce the power it provides to the devices 112 while the battery packs are recharging. However, as users of data center 102 typically pay based on an amount of AC power they use, having this additional AC power provided to rack 110 increases the costs to the user. Regardless of the manner in which the power supply controller is configured, the power supply controllers in rack power units 114 of different racks 110 can be configured differently. Accordingly, individual users of data center 102 are able to make their own decisions regarding how quickly the battery packs in their racks are to be recharged and whether power to the devices in their racks is reduced during recharging of the batteries, and have the rack power units configured accordingly.

The rack-based uninterruptible power supply discussed herein also facilitates a pay as you go model for building and filling data center 102. Rack power units, and battery packs included therein, are added to data center 102 as devices 112 are added to data center 102 (and based on the desires of the users of data center 102 as discussed above). For example, assume that data center 102 includes 50 racks, each capable of holding 88 devices 112, so data center 102 can hold up to 4400 devices 112. Rather than providing sufficient battery packs to provide power for 4400 devices, rack power units can be added (or chassis with battery packs can be added) as data center 102 is populated with devices 112. For example, if data center 102 has only 60 devices in one rack during the first month of operation, one or more rack power units to provide power for those 60 in can be added to that one rack. Accordingly, the expense of additional rack power units and battery packs to power additional devices 112 (up to 4340 devices 112) is deferred until those devices 112 are actually added to data center 102.

Additionally, in one or more embodiments one or more racks 110 provide feedback (e.g., to an administrator of data center 102) regarding the current usage or health of devices 112 and rack power units 114 in the rack. This feedback can be provided by a feedback module of a rack 110, which can be an individual component of rack 110 or alternatively can be incorporated into another component (e.g., a rack power unit 114). This usage or health feedback can be information indicating a current power usage of devices 112 in the rack, an average power usage of devices 112 in the rack, and current charge of battery packs in rack power units 114, and so forth. Such information can be obtained from the rack power units 114 (e.g., from power supply controllers 218 of FIG. 2), or alternatively can be obtained from another component or module of rack 110.

This usage or health information can be used in a variety of different manners. For example, an indication of a current charge of battery packs in each rack 110 can be displayed or otherwise presented at data center 102. By way of another example, the capacity of battery packs in a rack 110 and the average power usage of devices 112 in the rack can be used to determine a current hold-up time of the battery packs in the rack 110. This current hold-up time can be displayed to the administrator of data center 102, allowing the administrator to determine whether additional battery packs should be added to the rack 110, whether battery packs can be removed from the rack 110, and so forth. This current hold-up time can also be analyzed by the feedback module and a notification displayed or otherwise presented if the current hold-up time falls below a threshold amount (which can be configured to different values for each rack 110).

It should be noted that by having different rack power units 114 in different racks 110, in the event of a failure of a particular rack power unit 114 the devices in the same rack 110 as the failed rack power unit 114 are affected. For example, if the battery packs in a rack power unit 114 were to fail, the devices in the same rack 110 as that power unit 114 would not be powered by the battery packs in the event of an interruption in external AC power 106. However, the devices in the other racks 110 would still be powered by the battery packs in the rack power units 114 of those other racks 110.

Relative to a UPS designed for an entire data center, the rack-based uninterruptible power supply discussed herein facilitates providing a UPS to devices in a data center in a variety of different manners. Rather than using large, custom-built batteries for the entire data center, the rack-based uninterruptible power supply can employ smaller, more commonly available batteries. As these batteries are not custom-built, they are typically a lower cost than custom-built batteries. Furthermore, the cost of the batteries can be incurred as the capacity provided by those batteries is desired as discussed above. Additionally, various components (such as the battery packs and power supplies) can be designed and built to accommodate lower voltages because they manage the devices within a rack rather than all of the devices within a data center. For example, a UPS designed for an entire data center can be managing multiple megawatts of power, whereas a rack may typically manage ten or twenty kilowatts of power.

In addition, the rack-based uninterruptible power supply discussed herein facilitates providing a UPS to devices in a data center due to the knowledge, at each rack 110, of an interruption in external AC power 106. Each rack power unit 114 can respond in a variety of manners based at least in part on the knowledge of the interruption in external AC power 106 because each rack power unit 114 receives an indication of the interruption in external AC power 106 (in the form of the loss of external AC power 106). Furthermore, racks 110, devices 112, and rack power units 114 can be designed and built with the knowledge that a failure of a device or rack power unit can affect the devices and rack power units in the same rack 110, but not devices and rack power units in other racks 110. Thus, various redundancies and excess capacity need not be included because a failure does not affect the entire data center 102.

Relative to a UPS designed for an individual server, the rack-based uninterruptible power supply discussed herein facilitates providing a UPS to devices in a data center in a variety of different manners. One way in which the rack-based uninterruptible power supply facilitates providing a UPS to devices in a data center is that peak usages can be averaged across multiple devices. Accordingly, the rack power units 114 can be designed to accommodate peak usages from devices 112 that occur at different times. For example, rack power units 114 can be designed with the assumption that all devices 112 do not experience peak usage at the same time. Thus, the battery packs in rack power units 114 can have sufficient capacity to provide power during peak usage of one or a few devices 112 at the same time, but not all devices 112 at the same time.

Furthermore, the rack-based uninterruptible power supply discussed herein facilitates providing a UPS to devices in a data center by reducing costs incurred in obtaining battery packs. Custom-built batteries can be avoided, and the batteries need not be oversized for the racks 110 because the batteries can be selected based on the desired capacity for the devices 112 in the entire rack 110. For example, if a battery pack were to be placed in a device 112, situations can arise where the battery pack is to be custom-built or have larger capacity than is truly desired for that device 112. Such custom-built batteries or larger than desired capacity increases the cost of providing the battery pack for that device.

Additionally, the rack-based uninterruptible power supply discussed herein facilitates providing a UPS to devices in a data center by simplifying management of data center 102. Multiple devices 112 of the same type (e.g., servers) can be installed in the same or different racks 110. These same servers can be used despite different UPS desires for those servers because the UPS is managed at the rack level. For example, 125 servers of the same type (e.g., having the same configuration and the same stock-keeping unit (SKU)) can be ordered and installed in data center 102, even though some of these servers may not be backed up by battery packs in data center 102 while other servers are backed up by battery packs, some of these servers may have the battery packs in data center 102 that back them up recharged at different rates, and so forth.

Figure 4:
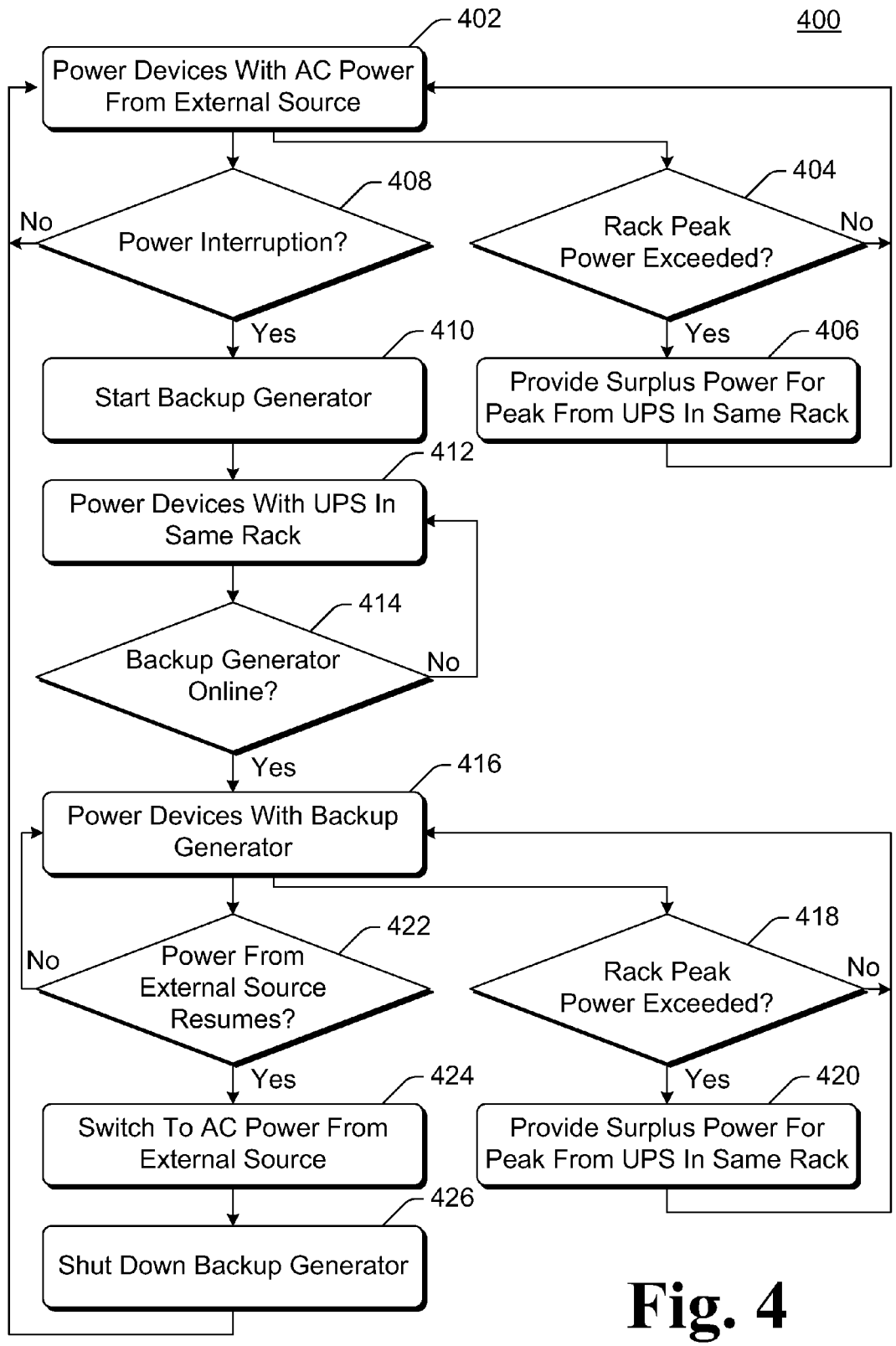
FIG. 4 is a flowchart illustrating an example process for operating a data center with rack-based uninterruptible power supplies in accordance with one or more embodiments.

FIG. 4 is a flowchart illustrating an example process 400 for operating a data center with rack-based uninterruptible power supplies in accordance with one or more embodiments. Process 400 is carried out by a rack power unit, such as rack power unit 200 of FIG. 2, and can be implemented in software, firmware, hardware, or combinations thereof. Process 400 is shown as a set of acts and is not limited to the order shown for performing the operations of the various acts. Process 400 is an example process for operating a data center with rack-based uninterruptible power supplies; additional discussions of operating a data center with rack-based uninterruptible power supplies are included herein with reference to different figures.

In process 400, devices in the rack are powered with AC power received from an external source (act 402). This external source can be a variety of different conventional external power sources as discussed above. The AC power is converted to DC power by one or more power supplies as discussed above.

A check is made as to whether the peak power of a rack is exceeded (act 404). This can be, for example, a check as to whether the capacity of the power supply is exceeded, or whether the power usage of the devices in the rack exceeds a threshold amount that is close to the capacity of the power supply (e.g., as discussed above with respect to act 304 of FIG. 3). If the rack peak power is not exceeded, then process 400 returns to act 402 without additional action being taken. However, if the rack peak power is exceeded, then surplus power is provided for the peak from the UPS in the rack (act 406). This UPS is the rack power unit implementing process 400, and this surplus power is provided by the battery packs in the rack power unit implementing process 400, an example of which is discussed in additional detail with reference to FIG. 3 above.

Additionally, a check is made as to whether there is a power interruption (act 408). There are a variety of different causes for power interruptions as discussed above. If there is no power interruption, then process 400 returns to act 402 without additional action being taken.

However, if there is a power interruption then a backup generator is started (act 410). This backup generator can be, for example, a diesel-powered or gas-powered generator as discussed above.

While the backup generator is starting, the devices within the rack are powered with the UPS in the rack (act 412). This UPS is the rack power unit implementing process 400, and the power is provided by the battery packs in the rack power unit implementing process 400.

A check is also made as to whether the backup generator is online and thus able to provide power to the devices in the rack (act 414). Devices within the rack continue to be powered with the UPS in the rack until the backup generator is online.

When the backup generator is online, devices in the rack are powered by the backup generator (416), and typically no longer need to be powered by the UPS. However, a check is made as to whether the peak power of a rack is exceeded (act 418), analogous to act 404 except that the AC power is being received from the backup generator at act 418 (rather than the external source at act 404). If the rack peak power is not exceeded, then process 400 returns to act 416 without additional action being taken. However, if the rack peak power is exceeded, then surplus power is provided for the peak from the UPS in the rack (act 420). This UPS is the rack power unit implementing process 400, and this surplus power is provided by the battery packs in the rack power unit implementing process 400, an example of which is discussed in additional detail with reference to FIG. 3 above.

Additionally, a check is made as to whether power from the external source has resumed (act 422). Devices within the rack continue to be powered with the backup generator (and optionally the UPS in act 420) until power from the external source resumes.

If power from the external source has resumed, then the rack is switched from being powered by the backup generator to being powered by the external source (act 424). The backup generator is shut down or powered off (act 426), and process 400 returns to act 402 where the devices in the rack are powered by AC power received form an external source. Providing surplus power from the UPS in act 420 can be ceased during switching of AC power from the backup generator to the external source (and optionally resumed in act 406), or alternatively can continue during switching of AC power from the backup generator to the external source.

Figure 5:
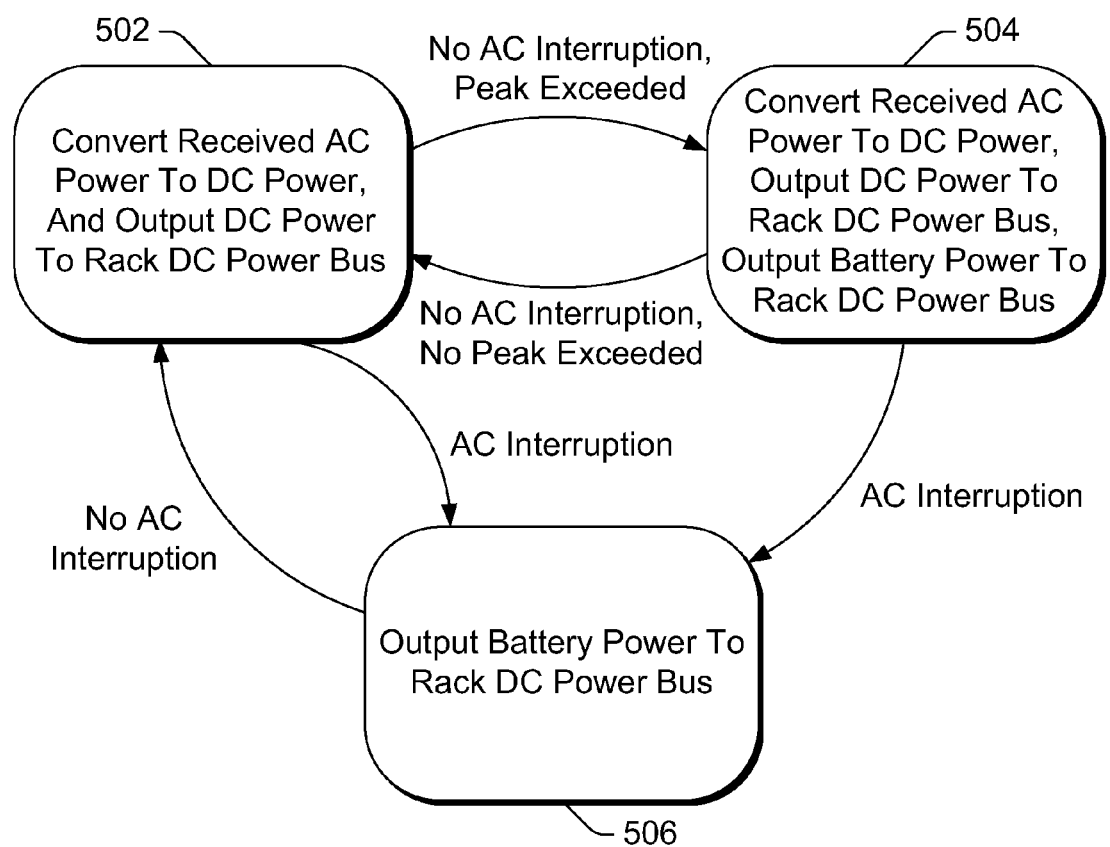
FIG. 5 is an example state diagram illustrating the operation of a rack power unit in accordance with one or more embodiments.

FIG. 5 is an example state diagram 500 illustrating the operation of a rack power unit in accordance with one or more embodiments. The rack power unit is, for example, a rack power unit 200 of FIG. 2. Initially, in state 502, AC power is received and converted to DC power, and the DC power is output to a rack DC power bus (e.g., bus 212 of FIG. 2). The rack power unit remains in state 502 unless there is an AC power interruption or a peak power of the rack is exceeded. Although peak power of the rack is referred to in state diagram 500, it is to be appreciated that other values can alternatively be used, such as a threshold value that is a fixed or relative amount less than the expected peak usage of the rack.

When in state 502, if there is no AC power interruption but the peak power of the rack is exceeded, then the rack power unit transitions to state 504. In state 504, AC power is received and converted to DC power, and the DC power is output to a rack DC power bus. Additionally, battery power is output to the rack DC power bus. The rack power unit remains in state 504 unless there is an AC power interruption or until peak power of the rack is no longer exceeded. If peak power of the rack is no longer exceeded, and there is no AC power interruption, then the rack power unit transitions to state 502.

When in state 502 or state 504, if there is an AC power interruption, then the rack power unit transitions to state 506. In state 506, battery power is output to the rack DC power bus. The rack power unit remains in state 504 until there is no longer an AC power interruption (whether due to the cause of the AC power interruption being resolved, or a backup generator is online), at which point the rack power unit transitions to state 502. Alternatively, if the rack power unit transitioned to state 506 from state 504, the rack power unit can transition back to state 504 rather than state 502.

Figure 6:
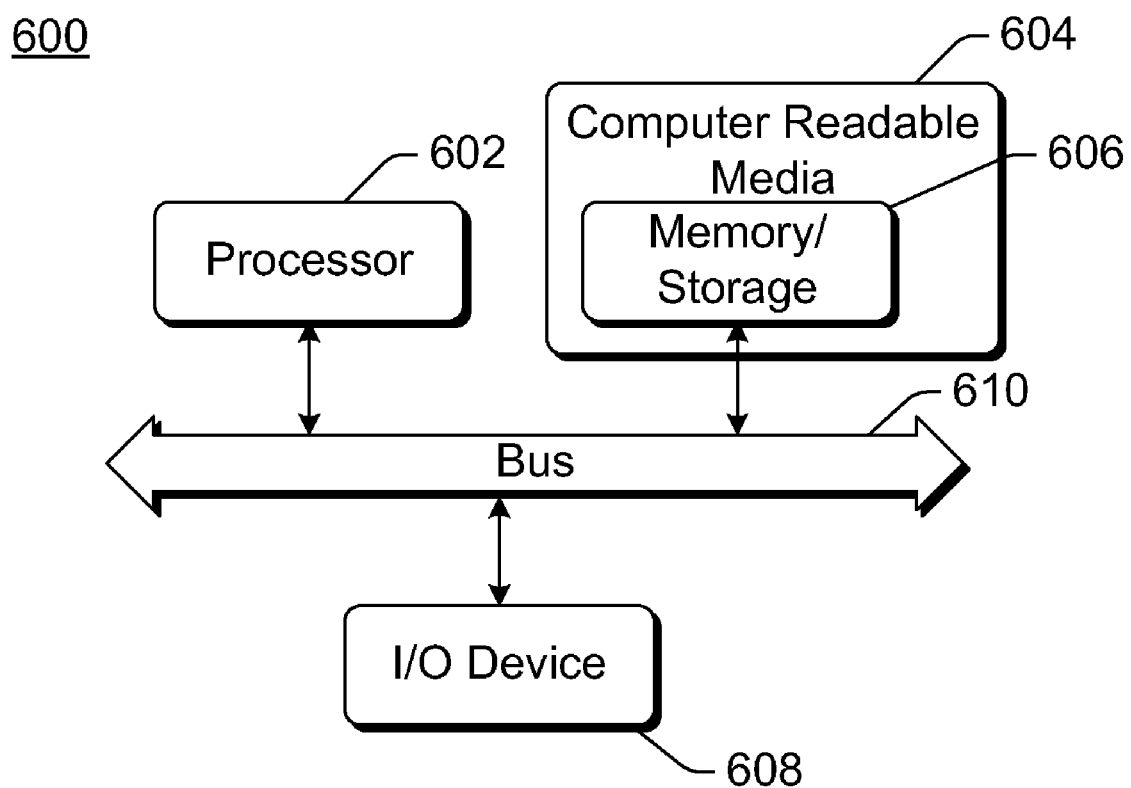
FIG. 6 illustrates an example computing device that can be configured to implement the rack-based uninterruptible power supply in accordance with one or more embodiments.

FIG. 6 illustrates an example computing device 600 that can be configured to implement the rack-based uninterruptible power supply in accordance with one or more embodiments. Computing device 600 can be, for example, power supply controller 218 or battery pack controller 220 of FIG. 2. Computing device 600 can also be a device 112 of FIG. 1.

Computing device 600 includes one or more processors or processing units 602, one or more computer readable media 604 which can include one or more memory and/or storage components 606, one or more input/output (I/O) devices 608, and a bus 610 that allows the various components and devices to communicate with one another. Computer readable media 604 and/or one or more I/O devices 608 can be included as part of, or alternatively may be coupled to, computing device 600. Bus 610 represents one or more of several types of bus structures, including a memory bus or memory controller, a peripheral bus, an accelerated graphics port, a processor or local bus, and so forth using a variety of different bus architectures. Bus 610 can include wired and/or wireless buses.

Memory/storage component 606 represents one or more computer storage media. Component 606 can include volatile media (such as random access memory (RAM)) and/or non-volatile media (such as read only memory (ROM), Flash memory, optical disks, magnetic disks, and so forth). Component 606 can include fixed media (e.g., RAM, ROM, a fixed hard drive, etc.) as well as removable media (e.g., a Flash memory drive, a removable hard drive, an optical disk, and so forth).

The techniques discussed herein can be implemented in software, with instructions being executed by one or more processing units 602. It is to be appreciated that different instructions can be stored in different components of computing device 600, such as in a processing unit 602, in various cache memories of a processing unit 602, in other cache memories of device 600 (not shown), on other computer readable media, and so forth. Additionally, it is to be appreciated that the location where instructions are stored in computing device 600 can change over time.

One or more input/output devices 608 allow a user to enter commands and information to computing device 600, and also allows information to be presented to the user and/or other components or devices. Examples of input devices include a keyboard, a cursor control device (e.g., a mouse), a microphone, a scanner, and so forth. Examples of output devices include a display device (e.g., a monitor or projector), speakers, a printer, a network card, and so forth.

Various techniques may be described herein in the general context of software or program modules. Generally, software includes routines, programs, objects, components, data structures, and so forth that perform particular tasks or implement particular abstract data types. An implementation of these modules and techniques may be stored on or transmitted across some form of computer readable media. Computer readable media can be any available medium or media that can be accessed by a computing device. By way of example, and not limitation, computer readable media may comprise "computer storage media" and "communications media."

"Computer storage media" include volatile and non-volatile, removable and non-removable media implemented in any method or technology for storage of information such as computer readable instructions, data structures, program modules, or other data. Computer storage media include, but are not limited to, RAM, ROM, EEPROM, flash memory or other memory technology, CD-ROM, digital versatile disks (DVD) or other optical storage, magnetic cassettes, magnetic tape, magnetic disk storage or other magnetic storage devices, or any other medium which can be used to store the desired information and which can be accessed by a computer.

"Communication media" typically embody computer readable instructions, data structures, program modules, or other data in a modulated data signal, such as carrier wave or other transport mechanism. Communication media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media. Combinations of any of the above are also included within the scope of computer readable media.

Generally, any of the functions or techniques described herein can be implemented using software, firmware, hardware (e.g., fixed logic circuitry), manual processing, or a combination of these implementations. The terms "module" and "component" as used herein generally represent software, firmware, hardware, or combinations thereof. In the case of a software implementation, the module or component represents program code that performs specified tasks when executed on a processor (e.g., CPU or CPUs). The program code can be stored in one or more computer readable memory devices, further description of which may be found with reference to FIG. 6. The features of the rack-based uninterruptible power supply techniques described herein are platform-independent, meaning that the techniques can be implemented on a variety of commercial computing platforms having a variety of processors.

Figure 7:
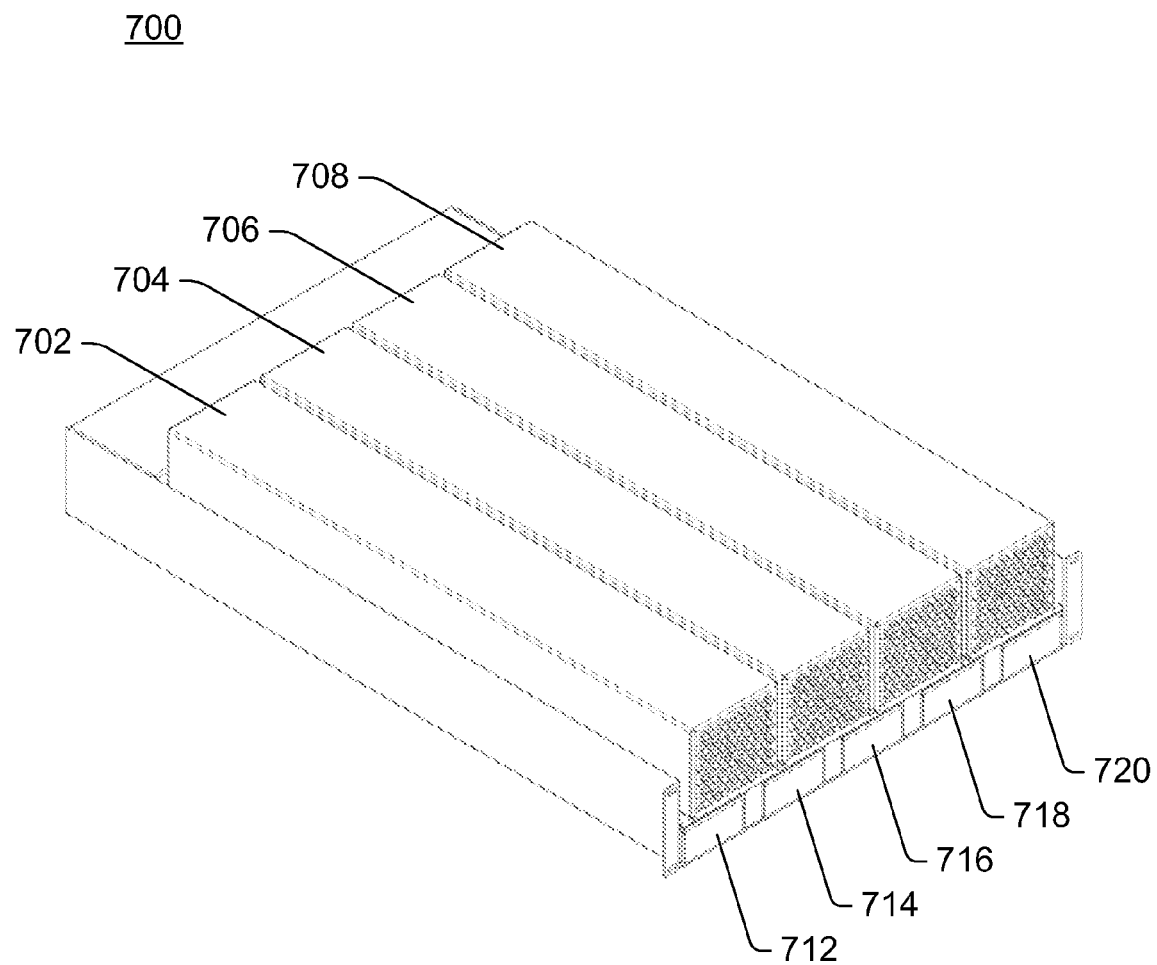
FIG. 7 illustrates an example rack power unit in accordance with one or more embodiments.

FIG. 7 illustrates an example rack power unit 700 in accordance with one or more embodiments. Rack power unit 700 can be, for example, a rack power unit 200 of FIG. 2 or a rack power unit 114 of FIG. 1. Rack power unit 700 includes four power supplies 702, 704, 706, and 708, and five battery packs 712, 714, 716, 718, and 720. Each power supply 702-708 can be, for example, a power supply 204 of FIG. 2. Each battery pack 712-720 can be, for example, a battery pack 206 of FIG. 2. Various ones of power supplies 702-708 and/or battery packs 712-720 can be replaced without powering down rack power unit 700 as discussed above. Although the example rack power unit 700 includes four power supplies and five battery packs, rack power unit 700 can include any number of power supplies and any number of battery packs as discussed above.

Figure 8:
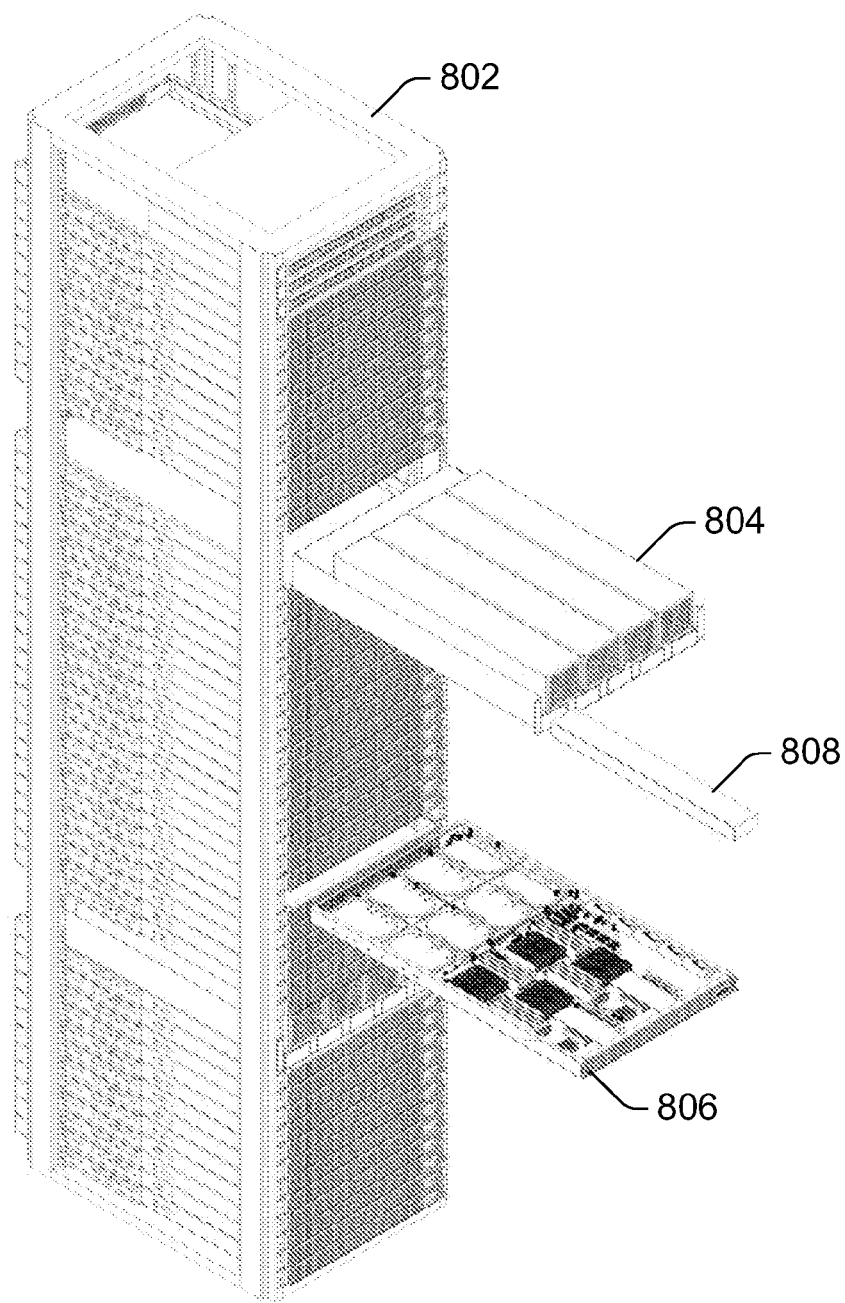
FIG. 8 illustrates an example rack assembly in accordance with one or more embodiments.

FIG. 8 illustrates an example rack assembly 800 in accordance with one or more embodiments. Rack assembly 800 includes a rack 802 housing multiple devices and/or rack power units. Rack 802 can be, for example, a rack 110 of FIG. 1. In the example of FIG. 8, a rack power unit 804 and a device 806 are illustrated in additional detail and removed from rack 802, and each of rack power unit 804 and device 806 can be inserted into rack 802. A battery pack 808 is also illustrated removed from power rack power unit 804, and can be inserted into rack power unit 804. Rack power unit 804 can be, for example, a rack power unit 700 of FIG. 7, a rack power unit 200 of FIG. 2 or a rack power unit 114 of FIG. 1. Device 806 can be, for example, a device 112 of FIG. 1. Although a single rack power unit 804 and device 806 are illustrated in additional detail, any number of rack power units and/or devices can be housed in rack 802.

Although the subject matter has been described in language specific to structural features and/or methodological acts, it is to be understood that the subject matter defined in the appended claims is not necessarily limited to the specific features or acts described above. Rather, the specific features and acts described above are disclosed as example forms of implementing the claims.

What is claimed is:

1. An apparatus comprising:
   one or more power supplies each configured to receive power, when the apparatus is in a device rack, and convert the received power to DC power, and further configured to output the DC power to a DC power bus of the device rack; and
   one or more battery packs each configured to provide, in response to an interruption in the received power, DC power to the DC power bus of the device rack, wherein the one or more power supplies is configured to, when the one or more battery packs have less than a critical threshold charge, throttle performance of one or more devices in the device rack while the one or more battery packs are recharged to have at least the critical threshold charge.

2. An apparatus as recited in claim 1, wherein a first battery pack of the one or more battery packs is included in a first chassis, a second battery pack of the one or more battery packs is included in a second chassis, and the first chassis and second chassis are both mounted in the device rack.

3. An apparatus as recited in claim 1, wherein a number of the one or more battery packs included in the apparatus is determined based at least in part on a number of devices included in the device rack and without regard for a number of devices included in other device racks.

4. An apparatus as recited in claim 1, wherein the one or more power supplies are further configured to resume receiving power from a backup generator after AC power from an external source is interrupted, and resume outputting DC power to the DC power bus without synchronizing the power output by the backup generator to the power output by the one or more battery packs.

5. An apparatus as recited in claim 1, wherein the one or more battery packs are further configured to provide DC power to the DC power bus in the event of a peak in power usage by one or more devices in the device rack and in the absence of an interruption in the received power.

6. An apparatus as recited in claim 1, wherein the one or more power supplies is further configured to determine when a current power usage of the device rack is below a critical power threshold amount, and to provide DC power to the one or more battery packs to recharge the one or more battery packs in response to determining that the current power usage of the device rack is below the critical power threshold amount.

7. An apparatus as recited in claim 6, wherein the one or more power supplies is further configured to provide DC power to the one or more battery packs concurrently with outputting the DC power to the DC power bus.

8. A data center comprising:
  a first device rack including a first rack power unit and a first plurality of devices, the first rack power unit including:
    a first one or more power supplies each configured to receive power, convert the received power to first DC power, and output the first DC power to a DC power bus of the first device rack, and
    a first one or more battery packs each configured to provide, in response to an interruption in the received power, second DC power to the DC power bus of the first device rack, wherein the first one or more power supplies is each further configured to, when the first one or more battery packs have less than a critical threshold charge, throttle performance of one or more devices in the first device rack while the first one or more battery packs are recharged to have at least the critical threshold charge;
  a second device rack including a second rack power unit and a second plurality of devices, the second device rack power unit including:
    a second one or more power supplies each configured to receive the power, convert the received power to third DC power, and output the third DC power to a DC power bus of the second device rack, and
    a second one or more battery packs each configured to provide, in response to an interruption in the received power, fourth DC power to the DC power bus of the second device rack.

9. A data center as recited in claim 8, further comprising a third device rack including a third power unit and a third plurality of devices, the third device rack power including, in the absence of one or more battery packs configured to provide DC power to a DC power bus of the third device in response to an interruption of the received power:
  a third one or more power supplies each configured to receive the power, convert the received power to fifth DC power, and output the fifth DC power to the DC power bus of the third device rack.

10. A data center as recited in claim 8, wherein the first one or more power supplies are configured to recharge the first one or more battery packs at a rate different than the second one or more power supplies are configured to recharge the second one or more battery packs.

11. A data center as recited in claim 8, wherein the first one or more battery packs have sufficient power to provide a first hold-up time for the first plurality of devices, wherein the second one or more battery packs have sufficient power to provide a second hold-up time for the second plurality of devices, and wherein the first hold-up time is different than the second hold-up time.

12. A data center as recited in claim 8, wherein a first battery pack of the first one or more battery packs is included in a first chassis, a second battery pack of the first one or more battery packs is included in a second chassis, and the first chassis and second chassis are both mounted in the first device rack.

13. A data center as recited in claim 8, wherein a number of the first one or more battery packs is determined based at least in part on a number of devices included in the first plurality of devices and without regard for a number of devices included in the second plurality of devices, and wherein a number of the second one or more battery packs is determined based at least in part on the number of devices included in the second plurality of devices and without regard for the number of devices included in the first plurality of devices.

14. A data center as recited in claim 8, wherein the first one or more power supplies and the second one or more power supplies are each further configured to resume receiving power from a backup generator after power from an external source is interrupted, and resume outputting the first DC power to the DC power bus of the first device rack or the third DC power to the DC power bus of the second device rack without synchronizing the power output by the backup generator to the power output by the first one or more battery packs or the second one or more battery packs.

15. A data center as recited in claim 8, wherein the first one or more battery packs are further configured to provide the first DC power to the DC power bus of the first device rack in the event of a peak in power usage by the first plurality of devices and in the absence of the received power.

16. A data center as recited in claim 8, wherein the first one or more power supplies is further configured to determine when a current power usage of the first device rack is below a critical power threshold amount, and to provide the first DC power to the first one or more battery packs to recharge the first one or more battery packs in response to determining that the current power usage of the first device rack is below the critical power threshold amount.

17. A data center as recited in claim 8, wherein the first one or more power supplies is each further configured to provide first DC power to the first one or more battery packs concurrently by outputting the first DC power to the DC power bus of the first device rack.

18. A method in a data center, the method comprising:
  powering, with one or more power supplies in a rack power unit in a device rack, devices in the device rack of the data center with DC power that is converted from received power from an external source into DC power by the one or more power supplies, and wherein the DC power is output by the one or more power supplies to a DC power bus of the device rack;
  in response to a power interruption,
    powering the devices in the device rack with DC power from one or more battery packs in the rack power unit, the one or more battery packs outputting DC power to the DC power bus;
    powering, after a backup generator is online, the devices in the device rack with received power from the backup generator rather than from the one or more battery packs, the one or more power supplies converting received power from the backup generator to DC power and outputting the DC power on the DC power bus;
  determining when the first one or more battery packs have less than a critical threshold charge; and
  throttling the performance of one or more devices in the first device rack while the first one or more battery packs are recharged to have at least the critical threshold charge.

* * * * *